METHOD OF ETCHING A SEMICONDUCTOR MATERIAL

Original Filed Jan. 21, 1963

INVENTOR
BENJAMIN TOPAS
BY [signature]
ATTORNEY

United States Patent Office 3,420,705

Patented Jan. 7, 1969

3,420,705

METHOD OF ETCHING A SEMICONDUCTOR MATERIAL

Benjamin Topas, Santa Monica, Calif., assignor, by mesne assignments, to Siemens Aktiengesellschaft, a corporation of Germany Continuation of application Ser. No. 254,540, Jan. 21, 1963, which is a continuation-in-part of application Ser. No. 117,573, June 16, 1961. This application July 27, 1966, Ser. No. 568,349

U.S. Cl. 117—201 1 Claim

Int. Cl. H01l *7/00*; C23c *17/00*

This application is a continuation of application Ser. No. 254,540, filed on Jan. 21, 1963, which was a continuation-in-part of application Ser. No. 117,573, filed on June 16, 1961, and now abandoned.

This invention relates to a process of preparing the surface of a single crystal semiconductor material for over-growth thereon from the vapor phase and, more particularly to a method of providing single crystal semiconductor substrates having a high degree of crystalline perfection beneath a planar surface.

Vapor growth of semiconductor junction devices involves deposition of a single crystal semiconductor layer of a predetermined conductivity type and degree from the vapor phase onto a single crystal semiconductor substrate located within a reaction chamber. In order to produce a more nearly perfect planar single crystal deposit by the vapor growth method, it is necessary that the substrate be planar and, even more important, that it be free of imperfections at and beneath the surface. A single crystal semiconductor substrate, for example, a wafer of single crystal silicon semiconductor material, has on and beneath its surface inhomogenities and impurities present as a result of cutting, lapping and polishing. These imperfections are known as "work damage." Semiconductor substrates thus prepared do not permit single crystal growth from the vapor phase thereon. Furthermore, the commonly used etching techniques employing solutions are carried out outside the reaction chamber in which the vapor growth step is performed and the etched wafers then must be introduced into the reactor.

Accordingly, it is an object of the present invention to provide a method of removing work damage at and beneath the surface of a single crystal semiconductor wafer.

Another object of the instant invention is to provide a single crystal semiconductor substrate having a high degree of purity and planarity and free of work damage at and beneath the surface.

Still another object is to provide a single crystal semiconductor substrate having a planar surface by a process of in situ removal of work damage at and beneath the surface of the crystal within a reaction chamber.

These and other objects are made apparent from the following more detailed description of the invention and from the following drawings in which.

In accordance with the present invention there is first provided a polished single crystal semiconductor "substrate wafer" having a degree of work damage which typically begins at the surface and extends some distance beneath the surface. Onto this substrate wafer is placed a second wafer, hereinafter referred to as the "lid wafer." The lid wafer also has a polished surface which is positioned adjacent to the polished surface of the substrate wafer. The assembled wafers are then heated for a predetermined period of time, in the presence of a thermally decomposable semiconductor gas whereupon a transfer of semiconductor material from the substrate wafer to the lid wafer occurs to a depth greater than that of the work damage, thereby forming a substrate wafer having a clean surface with a high degree of planarity and free of work damage at and beneath the surface.

Figure 1:
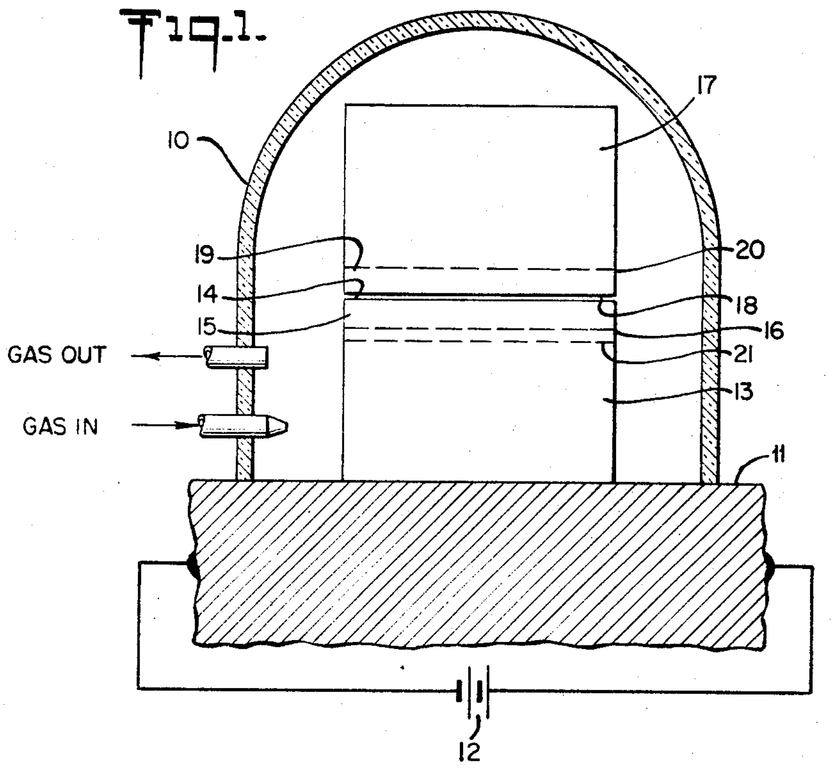
FIGURE 1 is a schematic illustration in section of the assembly of the present invention at the beginning of the process.

Referring now to FIGURE 1, there is shown in schematic illustration the wafer assembly within a reaction chamber in position for carrying out the process of the present invention.

The apparatus includes the reactor 10 in which is mounted a conductor support 11 which may be heated electrically by current source 12. Positioned on the support is substrate wafer 13 having a planar surface 14 and an area of work damage 15 which extends beneath the surface to a depth indicated at 16, generally in the order of microns. Adjacent the substrate wafer 13 with an interspace therebetween is a lid wafer 17 having a planar surface 18. An area of work damage 19 is also present in the lid wafer to a depth shown at level 20.

The thus-assembled wafers are then in a position whereby semiconductor material may be transferred from the substrate wafer to the lid wafer to a depth extending from the surface of the substrate wafer to a point below the depth of work damage in the wafer, for example, to a depth indicated at 21. To accomplish the desired transfer, the support 11 is heated to an elevated temperature, preferably above about 1,000° C. and below the melting point of the heater thereupon heating both the substrate wafer 13 and the lid wafer 17 by conduction from the thus-heated support 11. A temperature gradient is established running from a relatively high temperature at the surface 14 of the substrate wafer to a relatively lower temperature at the surface 18 of the lid wafer. This temperature gradient provides the necessary conditions to transfer a semiconductor material as described herein.

While in the reaction chamber, the wafers are maintained in an atmosphere of carrier gas as will be described hereinafter. The carrier gas can flow through the reactor in a continuous manner or, alternatively, the inlet and outlet valves may be closed and the gas permitted to remain stagnant within the reaction chamber.

In addition there is present a transfer gas which participates in the transfer of semiconductor material from the source to the substrate. In operation the transfer gas reacts with the source semiconductor material to form a small amount of a volatile compound in which the semiconductor is in an intermediate oxidation state. Upon contacting the substrate this compound disproportionates and deposits the semiconductor material upon the substrate wafer. As a byproduct of the disproportionation, a semiconductor compound in which the semiconductor is in a higher oxidation state is also formed. Preferably the transfer gas is a halogen or halogen-containing compound, such as iodine, chlorine, bromine, hydrogen chloride, hydrogen bromide, hydrogen iodide and the like. The gas may also be combined with the semiconductor, itself a thermally decomposable compound, as for example, silicochloroform, silicotetrachloride, silicotetrabromide, silicotetraiodide, etc. The mechanism of transfer will be illustrated more clearly with reference to the following chemical equations:

$$\underset{\text{(Source Semiconductor)}}{Si} + \underset{\text{(transfer gas)}}{SiCl_4} \underset{\longleftarrow}{\xrightarrow{\text{at source}}} 2SiCl_2 \text{ (inteomediate)}$$

$$2SiCl_2 \xrightarrow{\text{at substrate}} \underset{\text{(Transferred Semiconductor)}}{Si + SiCl_4}$$

Figure 2:
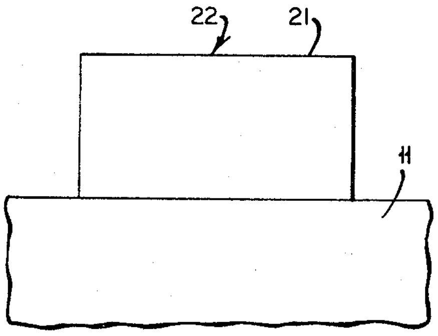
FIGURE 2 shows the semiconductor substrate at the conclusion of the process.
Figure 2A:
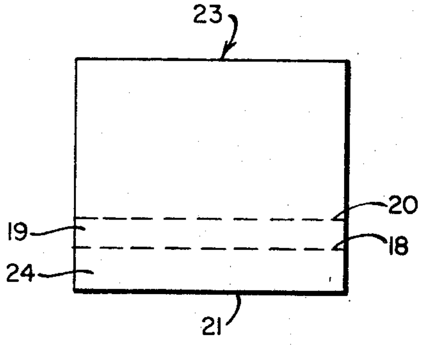
FIG. 2A is the lid wafer.

In a typical run, single crystal silicon semiconductor wafers having a diameter of about ¾ of an inch and a thickness of about 5 mils are mechanically polished and assembled in the manner shown in FIGURE 1 on a silicon support heated to about 1200° C. a hydrogen gas stream containing 4 g. of $SiHCl_3$ per 5 liters of $H_2$ is maintained in the reactor. Heating is continued for about 5 minutes in order to transfer about 25 microns of silicon from the substrate wafer to the lid wafer, thereby removing all work damage. Thereafter, the lid wafers are removed by exerting a force parallel to the attached surfaces so as to free them from the substate wafers. There is thus produced an in situ work-damage free planar single crystal silicon semiconductor substrate wafer 22 as shown in FIGURE 2 and improved lid wafer 23 illustrated in FIGURE 2A.

A particular advantage of the process of the present invention is that the work-damage free substrate wafer thus produced is immediately in position in the reactor for subsequent growth of semiconductor material thereon from the vapor phase.

While silicon has been described as the preferred semiconductor, it will be understood that other semiconductors, such as germanium, and Group III–V compounds, such as gallium arsenide, may be used as well.

When the foregoing experimental procedure is repeated using the following transport gases; iodine, chlorine, bromine, hydrogen chloride, hydrogen bromide, hydrogen iodide, silicotetrachloride, silicotetrabromide, and silicotetraiodide, semi-conductor structures as described heretofore are also produced.

When the procedure described in detail above for the preparation of silicon semiconductor bodies is repeated using germanium, gallium arsenide and gallium phosphide, work-damage-free semiconductor layers of germanium and gallium arsenide and gallium phosphide compounds are produced.

I claim:

1. The method of producing a plate-shaped semiconductor body consisting of an extremely planar surface and an epitactically applied semiconductor layer, upon said surface, which comprises placing a first semiconductor plate, provided with an extremely flat surface, and possessing processing damage below said surface, into a reaction vessel, said first semiconductor plate being placed inside the reaction vessel so that its flat surface lies opposite the flat surface of a second semiconductor plate and essentially parallel to the same, so that heating the first semiconductor plate produces a temperature gradient between these surfaces, heating the first semiconductor plate in a gaseous atmosphere, suitable for transporting the material from the first to the second semiconductor plate, by transport reaction, to a temperature suitable for said transport reaction, continuing the heating process until the region lying beneath the surface of the first plate is removed up to a layer thickness which exceeds the thickness of the region showing processing damages, removing the second semiconductor plate from the reaction chamber and using said first plate in the same reaction vessel as a substrate for epitactic precipitation from vapor phase of new semiconductor material upon its surface.

References Cited

UNITED STATES PATENTS 3,142,596 7/1964 Theuerer ---------- 148—175

WILLIAM L. JARVIS, *Primary Examiner.*

U.S. Cl. X.R.

117—106; 156—17